United States Patent
Liu et al.

(10) Patent No.: US 6,713,836 B2
(45) Date of Patent: Mar. 30, 2004

(54) PACKAGING STRUCTURE INTEGRATING PASSIVE DEVICES

(75) Inventors: Sheng-Tsung Liu, Kaohsiung (TW); Kang-Wei Ma, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 81 days.

(21) Appl. No.: 10/078,317

(22) Filed: Feb. 15, 2002

(65) Prior Publication Data

US 2002/0195693 A1 Dec. 26, 2002

(30) Foreign Application Priority Data

Jun. 22, 2001 (TW) .................................. 90115213 A

(51) Int. Cl.[7] ............................. H01L 29/00; H05K 7/20
(52) U.S. Cl. ..................... 257/528; 257/531; 257/532; 257/670; 257/672; 257/676; 257/690; 257/724; 257/783; 257/784; 361/723; 361/766; 361/767; 361/773; 361/776; 361/813
(58) Field of Search ................... 257/213, 288, 257/368, 499, 671, 678, 687, 694, 695, 723, 724, 734, 782, 783; 361/679, 729; 29/739, 741; 174/50, 52.1–52.4

(56) References Cited

U.S. PATENT DOCUMENTS

| | | | | |
|---|---|---|---|---|
| 5,089,878 A | * | 2/1992 | Lee | 257/664 |
| 5,093,713 A | * | 3/1992 | Sawaya | 257/724 |
| 5,198,964 A | * | 3/1993 | Ito et al. | 361/717 |
| 5,243,496 A | * | 9/1993 | Mermet-Guyennet | 361/748 |
| 5,281,846 A | * | 1/1994 | Kaiser | 257/528 |
| 5,391,915 A | * | 2/1995 | Mukai et al. | 257/643 |
| 5,532,910 A | * | 7/1996 | Suzuki et al. | 361/813 |
| 6,215,177 B1 | * | 4/2001 | Corisis et al. | 257/666 |
| 6,320,757 B1 | * | 11/2001 | Liu | 361/760 |
| 6,429,536 B1 | * | 8/2002 | Liu et al. | 257/786 |
| 6,486,535 B2 | * | 11/2002 | Liu | 257/666 |

FOREIGN PATENT DOCUMENTS

| | | | | |
|---|---|---|---|---|
| DE | 4021872 A1 | * | 1/1992 | H01F/15/10 |
| JP | 59054249 A | * | 3/1984 | H01L/23/12 |
| JP | 59 054254 A | * | 3/1984 | |
| JP | 50972757 A | * | 4/1984 | H01L/25/02 |
| JP | 02007459 A | * | 1/1990 | H01L/25/00 |
| JP | 05082697 A | * | 4/1993 | H01L/23/50 |

* cited by examiner

*Primary Examiner*—Alonzo Chambliss
(74) *Attorney, Agent, or Firm*—J.C. Patents

(57) ABSTRACT

In a leadframe packaging structure, a leadframe includes a plurality of first leads, a plurality of second leads, and a die pad. The first leads define a chip-bonding region in which is arranged the die pad. The second leads extend and terminate into a plurality of contact pads in the chip-bonding region. An adhesive tape further is bonded on bottom surfaces of the contact pads. A chip is bonded on the die pad. At least a passive device is mounted between and electrically connects the contact pads. A plurality of bonding wires respectively connect the chip, the passive device, and the first and second leads. An encapsulant material encapsulates the chip, the passive device, and the bonding wires.

15 Claims, 3 Drawing Sheets

PACKAGING STRUCTURE INTEGRATING PASSIVE DEVICES

CROSS-REFERENCE TO RELATED APPLICATION

This application claims the priority benefit of Taiwan application serial no. 90115213, filed Jun. 22, 2001.

BACKGROUND OF THE INVENTION

1. Field of the Invention

The invention relates to a packaging structure. More particularly, the present invention relates to a leadframe packaging structure that integrates passive devices.

2. Description of the Related Art

To eliminate negative electrical effects such as electromagnetic interference or undesirable coupling between leads in a leadframe packaging structure, passive devices are conventionally arranged on the leadframe of the leadframe packaging structure.

Referring to FIG. 1, a top view schematically illustrates a conventional leadframe structure used in packaging structures that integrate passive devices. At a central chip-bonding region 102 of the leadframe 100, a die pad 104 is conventionally arranged to carry a chip 106. Tie bars 108 are arranged around the die pad 104 as support elements to prevent warping of the die pad 104 during an encapsulating process. The leadframe 100 further comprises leads 110 around the die pad 104 and dam bars 116. The dam bars 116 define an encapsulating region 117 by separating the leads 110 into inner leads 112 and outer leads 114.

FIG. 2 is an enlarged view of the region 118 shown in FIG. 1. As shown in FIG. 2, two adjacent inner leads 112a are conventionally extended to form a contact pad 120. Supported by two leads 112a, the contact pad 120 is more rigid. Furthermore, a peripheral portion of the die pad 104 extends outwardly to provide another contact pad 122. A passive device 124 thereby can be conventionally mounted between and electrically connects the contact pads 120, 122. The leadframe thus arranged can integrate a passive device within a packaging structure to improve the electrical proprieties of the packaging structure.

However, because the space between the die pad and inner leads of the conventional leadframe is limited, the possibility of passive device arrangement on the conventional leadframe is also limited. Such a space limitation allows for a decoupling of only two adjacent leads and more distant leads cannot be decoupled.

SUMMARY OF THE INVENTION

An aspect of the present invention is to provide a leadframe packaging structure that integrates passive devices and overcomes the above problems by rearranging the leadframe structure.

To attain at least the foregoing objectives, a packaging structure integrating passive devices comprises, according to an embodiment of the present invention, a leadframe, a chip, at least a passive device, and an encapsulant material. The leadframe comprises a plurality of first leads that define a chip-bonding region within the leadframe. A die pad is arranged in the chip-bonding region. The chip is bonded on the die pad. A plurality of second leads extends and terminates in a plurality of contact pads in the chip-bonding region. An adhesive tape may be bonded onto bottom surfaces of the contact pads. At least a passive device is mounted between and electrically connects the contact pads. A plurality of bonding wires electrically connects the chip, the passive device, and the first and second leads to one another. The encapsulant material encapsulates the chip, the bonding wires and the passive device, and leaves an outer portion of the leads exposed.

It is to be understood that both the foregoing general description and the following detailed description are exemplary, and are intended to provide further explanation of the invention as claimed.

BRIEF DESCRIPTION OF THE DRAWINGS

The accompanying drawings is included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The following detailed description of the embodiments and examples of the present invention with reference to the accompanying drawings are only illustrative of specific structures and ways of making of the present invention, and does not limit the scope of the present invention.

Figure 1:
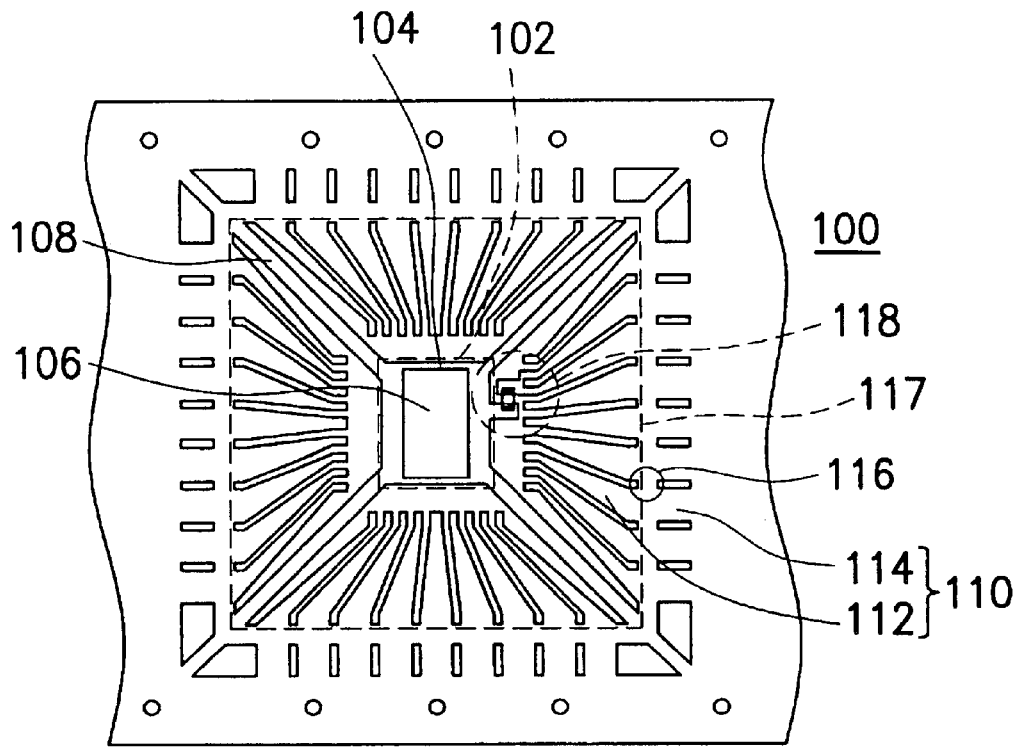
FIG. 1 is a top view schematically illustrating a conventional leadframe structure integrating a passive device.
Figure 2:
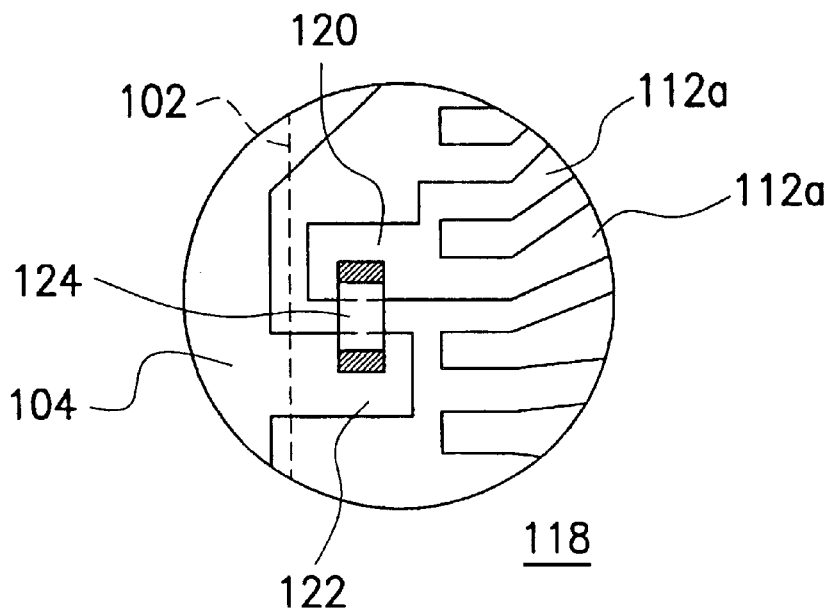
FIG. 2 is an enlarged view of a portion of FIG. 2 showing the leadframe at the passive device mounting location.
Figure 3:
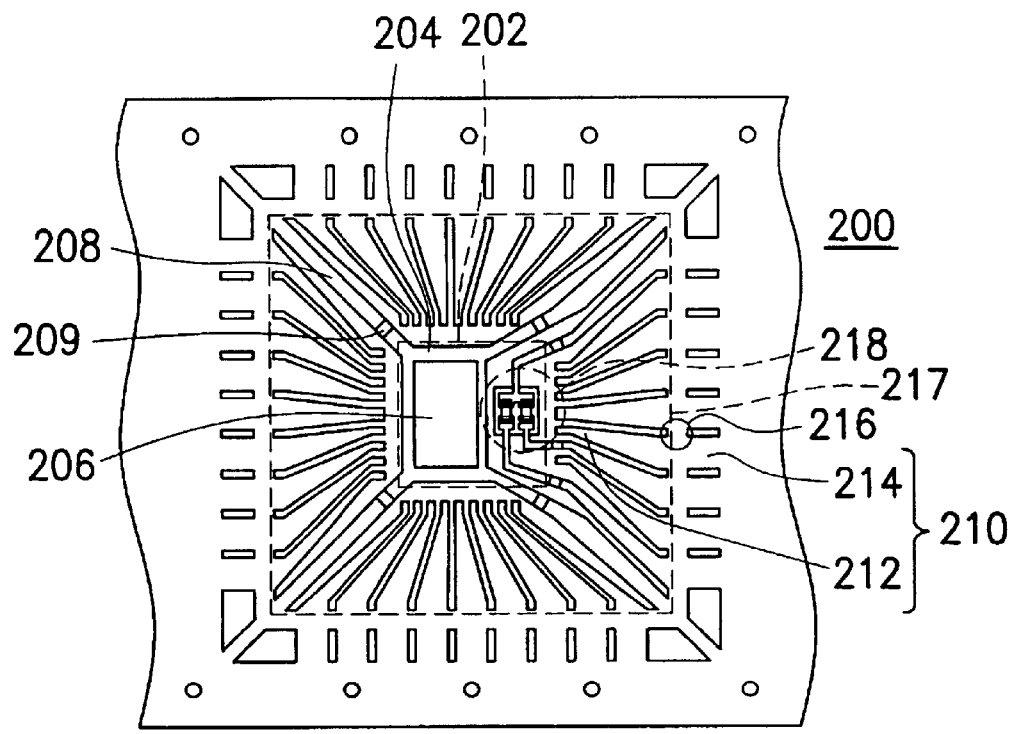
FIG. 3 is a top view schematically illustrating a leadframe structure arranged to integrate passive devices according to an embodiment of the present invention.

FIG. 3 is a top view schematically illustrating a leadframe structure for a semiconductor packaging structure integrating passive devices according to an embodiment of the present invention. A leadframe 200 includes a plurality of leads 210 that defines a chip-bonding region 202 substantially at a center part of the leadframe 200. A die pad 204 carrying a chip 206 is arranged within the chip-bonding region 202. The chip 206 may be bonded on the die pad 204 by, for example, adhesive tape having good heat dissipation ability. The location of the die pad 204 is biased to one side of the chip-bonding region 202 as shown in FIG. 3, where the die pad 204 is biased to the left side of the chip-bonding region 202.

As conventionally arranged, tie bars 208 connecting the die pad 204 to the leadframe 200 support the die pad 204. The tie bars 208 prevent the die pad 204 from bending when an encapsulating process is subsequently performed. A portion 209 of the tie bars 208 further may be downwardly bent to down-set the die pad 204.

Reference numeral 216 refers to a dam bar that defines an encapsulating region 217 delimited by dash-lines, by separating the leads 210 into inner leads 212 and outer leads 214.

Figure 4:
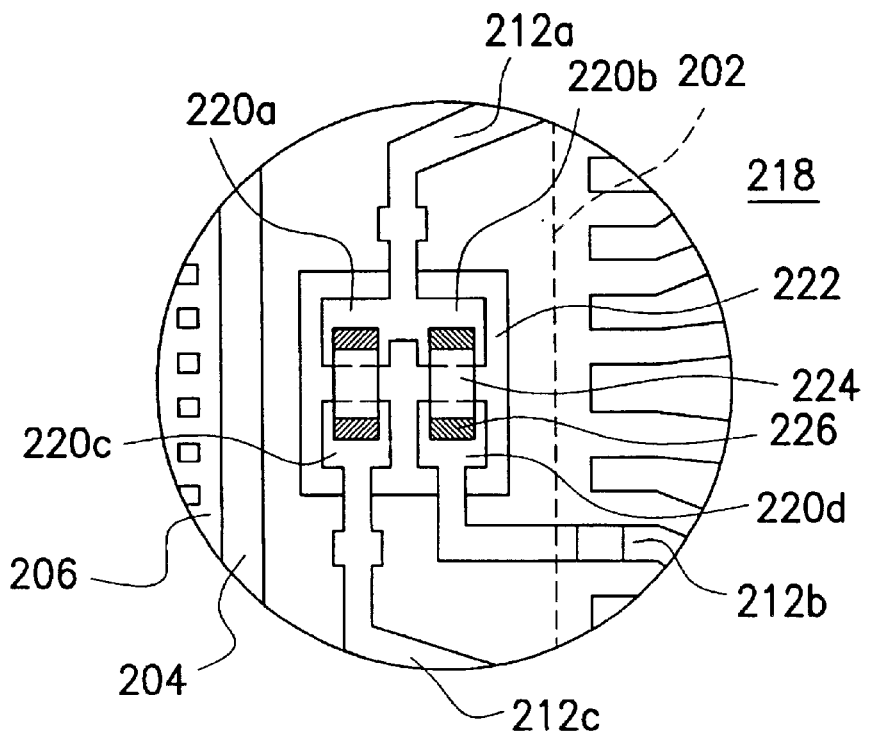
FIG. 4 and FIG. 5 are enlarged views of a portion of FIG. 3 showing the leadframe at the passive device mounting location according to an embodiment of the present invention.

FIG. 4 shows an enlarged view of the region 218 shown in FIG. 3. As shown in FIG. 4, inner leads 212a, 212b, 212c extend toward the chip-bonding region 202. More particularly, the inner lead 212a terminates in contact pads 220a, 220b within the chip-bonding region 202, and inner lead 212b and 212c respectively terminate in contact pads 220c and 220d within the chip-bonding region 202. The different inner leads 212a, 212b, 212c may be substantially distant from one another. Because the position of the die pad 204 is biased, the contact pads 220a, 220b, 220c, 220d can be arranged to converge in the chip-bonding region 202 such that the passive devices can be mounted thereon. An adhesive tape 222 may be further adhered on bottom surfaces of the contact pads 220a, 220b, 220c, 220d to provide better rigidity and substantially a same surface level of the contact pads 220a, 220b, 220c, 220d. The adhesive tape 222 preferably is an insulating material having good heat resistance such as polyimide to endure subsequent wire bonding and encapsulating processes.

As shown in FIG. 3 and FIG. 4, a passive device 224 via its contact pads 226 connects the contact pads 220b, 220d. The connection of the passive device 224 can be performed by known methods such as surface mount technology (SMT). The integration of passive device 224, such as a resistor, capacitor or inductor, improves electrical proprieties of the packaging structure. It is apparent that an appropriate arrangement of the die pad 204 may enable the integration of more than one passive device within the packaging structure such as shown in FIG. 4 where two passive devices are integrated. An option can be, for example, reducing the size of the die pad 204 and biasing its position within the chip-bonding region 202.

Figure 5:
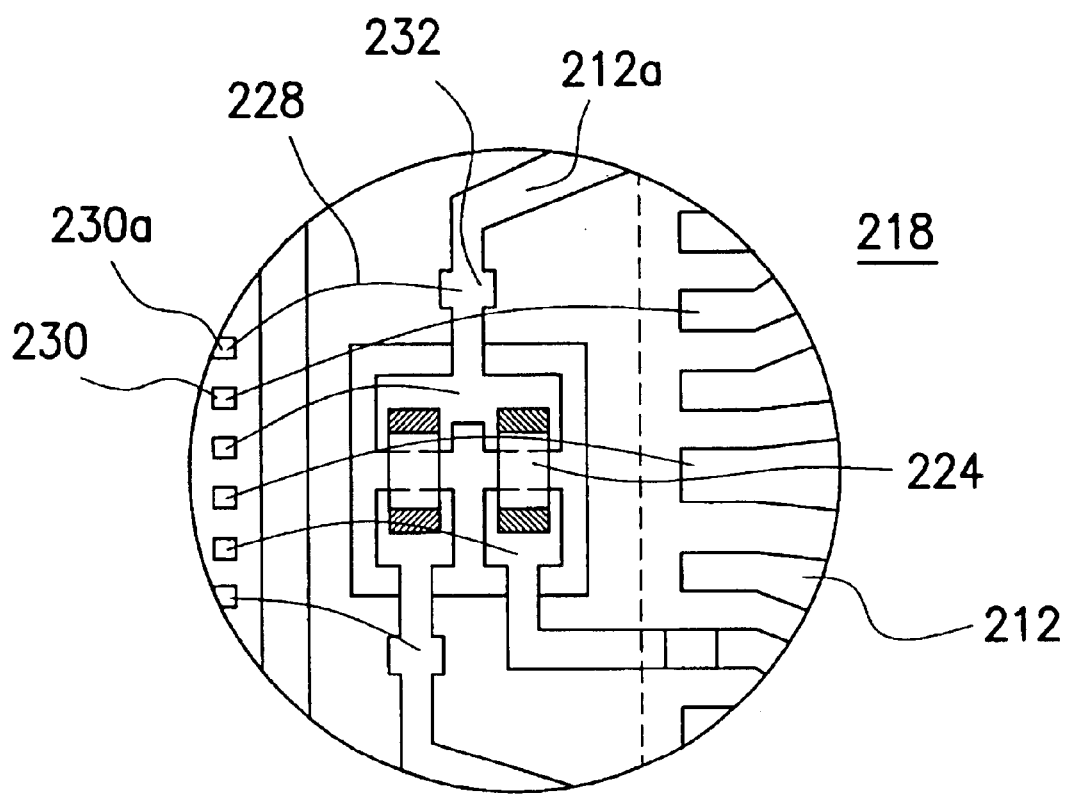

Referring to FIG. 4 and FIG. 5, two passive devices 224, for example, electrically connect the contact pads 220a, 220c and the contact pads 220b, 220d, respectively. A plurality of bonding wires 228 electrically connects the bonding pads 230 of the chip 206 arranged on the die pad 204 to the passive devices 224 and to other inner leads 212. The bonding wire 228 may connect the passive devices 224 by bonding onto the contact pads terminating the leads. A wire-bonding pad 232 also may be formed on the inner lead 212a within the chip bonding region 202 to facilitate the wire bonding between the passive device 224 and bonding pad 230a of the chip 206. After wire bonding, the chip 206, passive devices 224 and bonding wires 228 are encapsulated within an encapsulant material (not shown). Dam bars 216 (shown in FIG. 3) are cut and remaining outer leads 214 (shown in FIG. 3) are bent to achieve the packaging structure (not shown).

In conclusion, the present invention provides a leadframe structure capable of carrying chip and passive devices within packaging structures. The leadframe of the present invention includes inner leads that extend and terminate in contact pads proximate to a die pad biased within a chip-bonding region. As a result, the passive devices can decouple various leads of the leadframe that may be substantially distant from one another. The present invention is suitable for use with leadframe packaging structures such as Quad Flat Package (QFP), Plastic Chip Carrier Package (PLCC), Dual In-Line Package (DIP), Small Out-Line Package (SOP), etc.

It will be apparent to those skilled in the art that various modifications and variations can be made to the structure and operations of the present invention without departing from the scope or spirit of the invention.

What is claimed is:

1. A packaging structure integrating passive devices, comprising:

a leadframe, wherein the leadframe includes a plurality of first leads defining a chip-bonding region, a plurality of second leads extending and terminating in a plurality of contact pads within the chip-bonding region, and a die pad located at a sideways biased position in the chip-bonding region;

a chip bonded onto the die pad;

at least a passive device mounted between and connected to the contact pads;

a plurality of bonding wires electrically connecting the chip, the passive device, and the first and second leads to one another; and an encapsulant material encapsulating the chip, the passive device, and the bonding wires.

2. The packaging structure of claim 1, wherein the passive device connects the contact pads by surface mount technology.

3. The packaging structure of claim 1, wherein a portion of each first and second lead extends out of the encapsulant material.

4. A quad flat package including the packaging structure of claim 1.

5. A plastic chip carrier package including the packaging structure of claim 1.

6. The packaging structure of claim 1, further including an adhesive tape disposed on bottom surfaces of the contact pads to improve a rigidity of the contact pads.

7. The packaging structure of claim 1, wherein the passive device is a resistor, a capacitor or an inductor.

8. A leadframe structure suitable for use in a chip packaging structure, the leadframe structure comprising:

a plurality of first leads defining a chip-bonding region in the leadframe structure;

a plurality of second leads extending and terminating in a plurality of contact pads within the chip-bonding region; and a die pad arranged at a sideways biased position in the chip-bonding region.

9. The leadframe structure of claim 8, further including an adhesive tape bonded to bottom surfaces of the contact pads to improve a rigidity of the contact pads.

10. A packaging structure integrating passive devices, comprising:

a leadframe, wherein the leadframe includes a plurality of first leads defining a chip-bonding region, a plurality of second leads extending and terminating in a plurality of contact pads within the chip-bonding region, and a die pad located at a sideways biased position in the chip-bonding region;

an adhesive tape bonded to bottom surfaces of the contact pads;

a chip bonded onto the die pad;

at least a passive device mounted between and connected to the contact pads;

a plurality of bonding wires electrically connecting the chip, the passive device, and the leads to one another; and an encapsulant material encapsulating the chip, the passive device, and the bonding wires.

11. The packaging structure of claim 10, wherein a portion of each first and second lead extends out of the encapsulant material.

12. A quad flat package including the packaging structure of claim 10.

13. A plastic chip carrier package including the packaging structure of claim 10.

14. The packaging structure of claim 10, wherein the passive device is a resistor, a capacitor or an inductor.

15. A leadframe structure suitable for use in a chip packaging structure, the leadframe structure comprising:

a plurality of first leads defining a chip-bonding region in the leadframe structure;

a plurality of second leads extending and terminating in a plurality of contact pads within the chip-bonding region;

an adhesive tape bonded to bottom surfaces of the contact pads; and a die pad arranged at a sideways biased position in the chip-bonding region.

* * * * *